United States Patent
Cremer et al.

(10) Patent No.: US 12,061,840 B2
(45) Date of Patent: *Aug. 13, 2024

(54) METHODS AND APPARATUS FOR DYNAMIC VOLUME ADJUSTMENT VIA AUDIO CLASSIFICATION

(71) Applicant: Gracenote, Inc., Emeryville, CA (US)

(72) Inventors: Markus Cremer, Orinda, CA (US);
Robert Coover, Orinda, CA (US);
Steven D. Scherf, Oakland, CA (US);
Cameron Aubrey Summers, Oakland, CA (US)

(73) Assignee: Gracenote, Inc., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,792

(22) Filed: Aug. 22, 2023

(65) Prior Publication Data
US 2024/0045649 A1    Feb. 8, 2024

Related U.S. Application Data

(63) Continuation of application No. 17/380,936, filed on Jul. 20, 2021, now Pat. No. 11,775,250, which is a
(Continued)

(51) Int. Cl.
*G06F 3/16*    (2006.01)
*G10L 25/51*    (2013.01)
*G10L 25/30*    (2013.01)

(52) U.S. Cl.
CPC .............. *G06F 3/165* (2013.01); *G10L 25/51* (2013.01); *G10L 25/30* (2013.01)

(58) Field of Classification Search
None
See application file for complete search history.

(56) References Cited

U.S. PATENT DOCUMENTS

| 9,565,508 B1 | 2/2017 | Skovenborg |
| 2009/0190779 A1 | 7/2009 | Chung |

(Continued)

FOREIGN PATENT DOCUMENTS

| EP | 2352225 | 8/2011 |
| EP | 3026932 | 6/2016 |

(Continued)

OTHER PUBLICATIONS

Japanese Patent Office, "Notice for Reasons of Rejection", issued in connection with Japanese Patent Application No. 2021512702 on Jun. 28, 2022, 11 pages.
(Continued)

*Primary Examiner* — James K Mooney
(74) *Attorney, Agent, or Firm* — McDonnell Boehnen; Hulbert & Berghoff LLP

(57) ABSTRACT

Methods, apparatus, systems and articles of manufacture are disclosed for dynamic volume adjustment via audio classification. Example apparatus include at least one memory; instructions; and at least one processor to execute the instructions to: analyze, with a neural network, a parameter of an audio signal associated with a first volume level to determine a classification group associated with the audio signal; determine an input volume of the audio signal; determine a classification gain value based on the classification group; determine an intermediate gain value as an intermediate between the input volume and the classification gain value by applying a first weight to the input volume and a second weight to the classification gain value; apply the intermediate gain value to the audio signal, the intermediate gain value to modify the first volume level to a second volume level; and apply a compression value to the audio signal, the compression value to modify the second volume (Continued)

level to a third volume level that satisfies a target volume threshold.

20 Claims, 6 Drawing Sheets

Related U.S. Application Data continuation of application No. 16/563,717, filed on Sep. 6, 2019, now Pat. No. 11,086,591.

(60) Provisional application No. 62/745,148, filed on Oct. 12, 2018, provisional application No. 62/728,677, filed on Sep. 7, 2018.

(56) References Cited

U.S. PATENT DOCUMENTS

| | | |
|---|---|---|
| 2009/0220109 A1 | 9/2009 | Crockett et al. |
| 2011/0075851 A1 | 3/2011 | LeBouef et al. |
| 2012/0294461 A1 | 11/2012 | Maeda et al. |
| 2012/0328115 A1 | 12/2012 | Wolters et al. |
| 2013/0272542 A1 | 10/2013 | Tracey |
| 2015/0208152 A1 | 7/2015 | Hanna et al. |
| 2017/0048615 A1 | 2/2017 | Son et al. |
| 2018/0068670 A1 | 3/2018 | Lu et al. |
| 2019/0058939 A1 | 2/2019 | Yan et al. |

FOREIGN PATENT DOCUMENTS

| | | |
|---|---|---|
| GB | 2413745 | 11/2005 |
| JP | 2016519784 | 7/2016 |
| KR | 100746010 | 8/2007 |

OTHER PUBLICATIONS

International Searching Authority, "International Preliminary Report on Patentability," issued in connection with international Patent Application No. PCT/US2019/050080 on Mar. 9, 2021, 7 pages.

Wikipedia, "Auditory Scene Analysis," Archived Aug. 2, 2018, retrieved from the Internet on Aug. 3, 2020, [https://en.wikipedia.org/w/index.php?title=Auditory_scene_analysis&oldid=853076719], 3 pages.

International Searching Authority, "International Search Report," issued in connection with international Patent Application No. PCT/US2019/050080 on Dec. 26, 2019, 5 pages.

International Searching Authority, "Written Opinion of the International Search Authority," issued in connection with international Patent Application No. PCT/US2019/050080 on Dec. 26, 2019, 6 pages.

United States Patent and Trademark Office, "Non-Final Office Action", issued in connection with U.S. Appl. No. 16/563,717, filed Apr. 1, 2020, 9 pages.

United States Patent and Trademark Office, "Final Office Action", issued in connection with U.S. Appl. No. 16/563,717, filed Oct. 5, 2020, 16 pages.

United States Patent and Trademark Office, "Notice of Allowance and Fee(s) Due", issued in connection with U.S. Appl. No. 16/563,717, filed Apr. 9, 2021, 8 pages.

United States Patent and Trademark Office, "Corrected Notice of Allowability", issued in connection with U.S. Appl. No. 16/563,717, filed Apr. 20, 2021, 2 pages.

European Patent Office, "Supplementary European Search Report", issued in connection with European Patent Application No. 19 85 8595.4 on May 3, 2022, 13 pages.

METHODS AND APPARATUS FOR DYNAMIC VOLUME ADJUSTMENT VIA AUDIO CLASSIFICATION

RELATED APPLICATIONS

This patent arises from a continuation of U.S. patent application Ser. No. 16/563,717, filed on Sep. 6, 2019, which claims priority to, and benefit of, U.S. Provisional Application 62/728,677, which was filed on Sep. 7, 2018, and U.S. Provisional Application 62/745,148, which was filed on Oct. 12, 2018. U.S. patent application Ser. No. 16/563,717, U.S. Provisional Application 62/702,734, and U.S. Provisional Application 62/745,148 are hereby incorporated by reference in their entireties.

FIELD OF THE DISCLOSURE

This disclosure relates generally to volume adjustment, and, more particularly, to methods and apparatus for dynamic volume adjustment via audio classification.

BACKGROUND

In recent years, a multitude of media of varying characteristics has been delivered using an increasing number of channels. can be received using more traditional channels (e.g., the radio), or using more recently developed channels, such as using Internet-connected streaming devices. As these channels have developed, systems which are able to process and output audio from multiple sources have been developed as well. Some automobile media systems, for example, are capable of delivering media from compact discs (CD's). Bluetooth connecting devices, universal serial bus (USB) connected devices, Wi-Fi connected devices, auxiliary inputs, and other sources.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
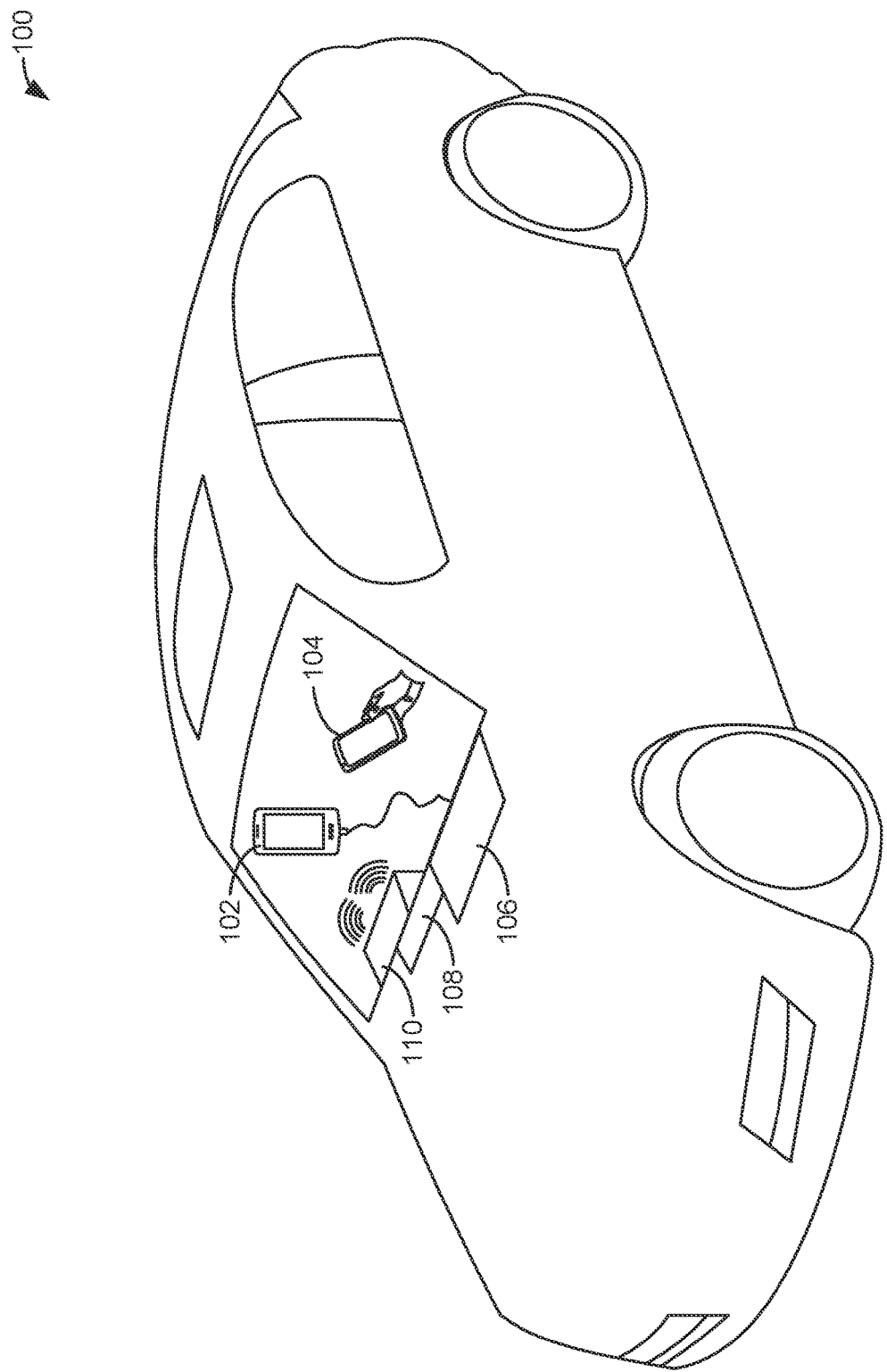
FIG. 1 is a schematic illustration of an example system constructed in accordance with the teachings of this disclosure for dynamic volume adjustment via audio classification.

In conventional audio media implementations, audio signals associated with different media may have different volumes. For example, media on one CD may be recorded and/or mastered at a significantly different volume than media of another CD. Similarly, media retrieved from a streaming device may have significantly different volume levels than media retrieved from a different device, or media retrieved from the same device via a different application. As users increasingly listen to media from a variety of different sources, differences in volume levels between sources and between media of the same source can become very noticeable, and potentially irritating to a listener.

In some conventional approaches to volume regularization, dynamic range compressors are utilized to compress the overall dynamic range of an audio signal to satisfy a volume threshold. In some conventional implementations, such dynamic range compression continually monitors and adjusts the volume of the audio signal in order to satisfy a volume threshold for the audio signal. Such continuous adjustment has a perceptible impact on a listener's perception of the audio signal, as the original dynamics of the track are significantly altered. In some examples, dynamic range compression significantly degrades the perceived quality of the audio signal (e.g., by introducing artifacts into the audio).

In example methods, apparatus, systems and articles of manufacture disclosed herein, audio classification is used to determine a category of the audio signal, and subsequently perform volume adjustment to minimize an amount of dynamic range compression that is required to bring an audio signal to within a target volume range. Example methods, apparatus, systems and articles of manufacture disclosed herein utilize a combination of classification of the audio signal and real-time input audio measurements to determine a targeted gain value that can be applied to the audio signal. For example, after determining a classification group associated with the audio signal, a classification gain value can be retrieved (e.g., from a look-up table relating volume gain adjustment values to the classification groups). An input volume for the audio signal can additionally be determined. Then, based on the input volume and the recommended classification gain value, a targeted gain value can be determined. The targeted gain value is a volume adjustment applied to the input audio signal to bring the volume closer to a target volume range (e.g., within +/−1 dbFS of −21 dbFS), so that when the gain-adjusted signal is provided to the compressor, the amount of compression needed to bring the gain-adjusted signal within the target volume range is reduced.

In example, methods, apparatus, systems, and articles of manufacture disclosed herein, a targeted gain value is computed based on a classification of the input audio signal and based on the input volume of the audio signal to reduce the amount of compression that is required to bring the volume of the audio signal within the target volume range. In some examples, when an input audio signal is first detected, the dynamic range of the audio signal is initially compressed to bring the volume of the audio signal within the target volume range until the input audio signal is classified and the volume of the input audio signal is determined. In some examples, by utilizing only compression to adjust the audio signal when the audio signal is first detected, a listener may briefly notice the compression as a decrease in audio level not resulting from a manual volume adjustment. However, once the initial volume of the audio signal and a classification of the audio signal are determined, a targeted gain value is computed to reduce the amount of compression that is required to bring the volume of the audio signal within the target volume range. In some examples, the classification and initial volume determination may occur quickly enough (e.g., within five seconds, within one second, etc.) that the initial use of compression is not noticeable by the listener.

Some example methods, apparatus, systems, and articles of manufacture disclosed herein determine and react to changes in the source of the audio signal. In some examples, an initial volume adjustment is performed in addition to, or alternatively to the use of compression. For example, in response to an audio signal input change (e.g. a change from no audio signal to an audio signal being presented, a change from one audio signal input source to another audio signal input source, etc.), an initial volume level may be determined (e.g., based on a previous volume adjustment setting specific to the source of the audio signal) and an initial volume level adjustment may be performed. In some examples, the initial volume level adjustment is performed using a "fade-in" technique, which gradually increasing the audio volume level after an input signal change. In some examples, the initial volume level adjustment may be based on a stored setting associated with a type of audio input signal (e.g., FM radio, AM radio, CD, auxiliary audio source, etc.).

Example methods, apparatus, systems, and articles of manufacture disclosed herein classify audio signals into one or more of a plurality of classification groups. In determining a classification group, characteristics of the classification group (e g, an amount of headroom available, a typical dynamic range, etc.) can be used to adjust the volume of an audio signal with minimal losses (e.g., utilizing minimal dynamic range compression). In some examples, classification groups may be identified using pattern recognition in training data. For example, audio signals can be grouped based on factors such as instruments that are represented in the signals, years the audio signal was produced, genre of music, etc. Once the training data is grouped, characteristics such as a distribution of dynamic range values, a distribution of volume values, or any other audio characteristics are stored in association with the classification groups (e.g., in look-up tables). In some examples, when classifying an audio signal, a probability distribution may be determined (e.g., as opposed to outputting one specific classification group to which the audio signal belongs). For example, the classification process may output that there is a 50% chance the audio signal belongs to a group representing music without drums from 1976-1995, a 30% chance the audio signal belongs to a group representing music without drums from 1996 to current, an 18% chance the audio signal belongs to a group representing music with synthetic drums from 1976-1995, or a 2% chance it belongs to another group. In some such examples, selecting a gain value associated with the classification group to perform volume adjustment may involve an averaging technique (e.g., determining gain values associated with each of the groups, and weighting each of the values according to the probability that the audio signal belongs to the respective groups).

In some example methods, apparatus, systems and articles of manufacture disclosed herein, a large corpus of volume profiles of a representative variety of audio signals (e.g., representing numerous genres, numerous time periods, etc.) are utilized to train an audio signal classifier to perform classification of audio signals. For example, the volume profiles include volume values at times in a song. In some examples, other profiles and/or representations of audio signals may be utilized to train the audio signal classifier in addition to, or alternatively to, volume profiles. In some examples, clustering is performed on the volume profiles to train the audio signal classifier. In some examples, the audio signal classifier is trained to determine clusters of the volume profiles based on volume, dynamic range, and/or any other property of the volume profiles. The audio signal classifier can cluster the volume profiles in groups of dynamic ranges and then the audio signal classifier can assign incoming audio (e.g., input audio signals) to one or more of the classification groups.

In example methods, apparatus, systems and articles of manufacture disclosed herein, after determining a classification group for an audio signal, a volume level of the audio signal can be adjusted by applying a gain value to the audio signal. The gain value can be specific to the classification group. For example, if the classification group is associated with audio signals with a relatively small, normalized, dynamic range (e.g., as in some pop music), a significant volume adjustment can be made to bring the volume level of the audio signal to near a target volume range (e.g., since it is possible to determine an approximate volume deviation throughout the track). Conversely, if the classification group is associated with audio signals that have a relatively wide dynamic range, a smaller volume adjustment may be made, to keep the audio signal within audible levels.

Following the application of a gain value based on the classification group associated with the audio signal, compression can be utilized to bring the volume of the audio signal within the target volume range. As dynamic range compression may result in reduced overall audio quality (e.g., some loss of the audio signal), example methods, apparatus, systems, and articles of manufacture disclosed herein improve volume adjustment techniques by first applying a gain value specific to the type of audio being presented (e.g., specific to the classification group), and therefore reduce the amount of dynamic range compression required to adapt the volume level of the audio signal to be within the target volume range.

In some example methods, apparatus, systems and articles of manufacture disclosed herein, once an audio signal is classified in a dynamic volume adjustment setting, characteristics of the audio signal are inferred from its classification group and utilized to determine a targeted gain value to bring the volume of the audio signal near the target volume threshold with minimal or no compression.

In some example methods, apparatus, systems, and articles of manufacture disclosed herein, an input volume measurement is considered when determining the targeted gain value. For example, if the input volume is determined to be at −15 dbFS, and the target volume range is +/−1 dbFS within −21 dbFS (e.g., −20 dbFS to −22 dbFS), the targeted gain value should be a smaller negative gain value than if the input volume is determined to be at −10 dbFS, even if the classification group is constant. In some such examples, when determining the targeted gain value, input volume measurements are weighted more heavily than the classification gain value, because ultimately the actual input volume level of the specific audio signal is more indicative of the amount the volume can be adjusted than a prediction based on a class (e.g., real-time measurements may be more accurate than predictions associated with the class of the audio signal). In some examples, an average between the classification gain value and the input volume is determined to calculate the targeted gain value. For example, if the input volume is determined to be −15 dbFS, and the classification gain value (e.g., determined based on the average dynamic range of audio signals of the classification group) indicates the volume can be adjusted by −6 dbFS, but the target volume range is +/−1 dbFS of −21 dbFS, relying merely on the classification gain value would provide extremely little room for error (e.g., if the dynamic range is larger than expected, the volume will likely frequently fall outside of the −020 dbFS to 22 dbFS target volume range). Instead, if the targeted gain value is computed as an intermediary (e.g., an average) between the input volume and the classification gain value, the targeted gain value will bring the volume of the audio signal closer to the targeted gain value while still leaving room for error.

In some example methods, apparatus, systems and articles of manufacture disclosed herein, input volume levels are measured at regular intervals (e.g., every three seconds, every ten seconds, etc.) and classification is performed at regular intervals. In response to changes in the input volume (e.g., a change in the average input volume over the interval, a change in the deviation of the input volume over the interval), and/or in response to changes in the classification group, a new targeted gain value can be determined. In some examples, when transitioning between targeted gain values, a smoothing filter can be utilized to smoothly transition between the two gain values to avoid noticeable fluctuations in volume at each interval. In some examples, larger changes in the targeted gain value are ramped in at a slower rate than relatively minor changes in the targeted gain value.

Example methods, apparatus, systems, and articles of manufacture disclosed herein adjust volume levels of audio signals to be within a target volume range. In some examples, a listener may then adjust the volume level manually (e.g., by turning a volume knob, by providing voice instructions to change a volume level, etc.), which then occurs by applying a gain value to the volume adjusted audio signal. Thus, a listener may still choose the volume at which they listen to the audio signal, but they are able to do so from a consistent standard volume level (e.g., from the target volume range), as opposed to adjusting for variations between different sources, variations between tracks, etc. Thus, techniques disclosed herein enable the input audio to be adjusted to be locked within a consistent volume range. In some example methods, apparatus, systems and articles of manufacture disclosed herein, dynamic volume adjustment may be ceased upon a manual volume adjustment. For example, if a user manually adjusts the volume level (e.g., by turning a volume knob, by providing voice instructions to change a volume level, etc.), automated adjustment of the audio level (e.g., by classifying the audio, selecting a gain value based on the classification, monitoring the audio levels, etc.) may cease, to enable the user to fully control the audio level.

In some example methods, apparatus, systems and articles of manufacture disclosed herein, audio signals may be identified to further improve volume adjustment. For example, in some example techniques disclosed herein, audio fingerprints are utilized to identify media in order to retrieve metadata pertaining to the audio signal. Audio fingerprinting is a technique used to identify media such as television broadcasts, radio broadcasts, advertisements (television and/or radio), downloaded media, streaming media, prepackaged media, etc. Existing audio watermarking techniques identify media by embedding one or more audio codes (e.g., one or more fingerprints), such as media identifying information and/or an identifier that may be mapped to media identifying information, into an audio and/or video component. In some examples, the audio or video component is selected to have a signal characteristic sufficient to hide the watermark. As used herein, the terms "fingerprint," "code," "signature," or "watermark" are used interchangeably and are defined to mean any identification information (e.g., an identifier) that may be inserted or embedded in the audio or video of media (e.g., a program or advertisement) for the purpose of identifying the media or for another purpose such as tuning (e.g., a packet identifying header). As used herein "media" refers to audio and/or visual (still or moving) content and/or advertisements. To identify fingerprinted media, the fingerprint(s) are extracted and used to access a table of reference fingerprints that are mapped to media identifying information.

In examples disclosed herein, the volume adjustment may be performed by a component of, or by a component in communication with, an audio system of a vehicle. In some examples, a media unit including a dynamic volume adjuster or other component capability of dynamic volume adjustment may be included in the vehicle's head unit. In such examples, the vehicle head unit may receive audio signals from an auxiliary input, a CD input, a radio signal receiver input, an external stream from a smart device, a Bluetooth input, a network connection (e.g., a connection to the Internet), or via any other source. For example, the dynamic volume adjustment may be performed on a media system in a home entertainment system, wherein multiple sources (e.g., a DVD player, a set top box, etc.) may communicate audio signals that are dynamically adjusted to attempt to normalize volume levels between sources and media. In other examples, dynamic volume adjustment may be performed in any setting or for any media device(s).

In an example procedure for dynamic volume adjustment via audio classification, an audio signal is accessed which corresponds to normalized, high-volume pop music. After detecting the audio signal input change associated with the audio signal, a dynamic range compressor compresses the audio to a target volume range (e.g., −21 dbFS). In parallel with this compression, an audio signal classifier determines a classification group corresponding to the audio signal. For example, the classification group may correspond to music with synthetic drums and bass from a time period of 1996 to the present. This classification group may be associated with a specific volume adjustment level (e.g., −15 dbFS). In some examples, this volume adjustment level associated with the classification group may be considered in addition to or alternatively to a volume level adjustment that is determined based on a current audio volume level. Following a volume adjustment associated with this volume adjustment level, only minor amounts of audio compression need to be performed to arrive at the target volume range. For example, if the volume adjustment step brings the volume down to a first value (e.g., −17.50 dbFS), and the target volume range is around a second value greater than the first value (e.g., −21 dbFS), small amounts of audio compression can be performed to bring the audio signal to the first value (e.g., to around −21 dbFS, and to within the target volume range). Therefore, with dynamic range compression only being performed to lower a signal by a small amount (e.g., 3.5 dbFS), the audio quality is significantly better than lowering a signal that needs to be compressed from the original audio input to the target volume range (e.g., compressing the audio signal for −21 dbFS).

FIG. 1 is a schematic illustration of an example system 100 constructed in accordance with the teachings of this disclosure for dynamic volume adjustment. The example system 100 includes media devices 102, 104 that transmit audio signals to a media unit 106. The media unit 106 processes the audio signals and transmits the signals to an audio amplifier 108, which subsequently outputs the amplified audio signal to be presented via an output device 110.

The example media device 102 of the illustrated example of FIG. 1 is a portable media player (e.g., an MP3 player). The example media device 102 stores or receives audio signals corresponding to media and is capable of transmitting the audio signals to other devices. In the illustrated example of FIG. 1, the media device 102 transmits audio signals to the media unit 106 via an auxiliary cable. In some examples, the media device 102 may transmit audio signals to the media unit 106 via any other interface.

The example media device 104 of the illustrated example of FIG. 1 is a mobile device (e.g., a cell phone). The example media device 104 stores or receives audio signals corresponding to media and is capable of transmitting the audio signals to other devices. In the illustrated example of FIG. 1, the media device 104 transmits audio signals to the media unit 106 wirelessly. In some examples, the media device 104 may use Wi-Fi, Bluetooth, and/or any other technology to transmit audio signals to the media unit 106. In some examples, the media device 104 may interact with components of a vehicle or other devices for a listener to select media for presentation in the vehicle. The media devices 102, 104 may be any devices which are capable of storing and/or accessing audio signals. In some examples, the media devices 102, 104 may be integral to the vehicle (e.g., a CD player, a radio, etc.).

The example media unit 106 of the illustrated example of FIG. 1 is capable of receiving audio signals and processing them. In the illustrated example of FIG. 1, the example media unit 106 receives media signals from the media devices 102, 104 and processes them to perform dynamic volume adjustment. The example media unit 106 is capable of identifying audio signals based on identifiers embedded in the media (e.g., fingerprints, watermarks, signatures, etc.). The example media unit 106 is additionally capable of accessing metadata corresponding to media associated with an audio signal. In some examples, the metadata is stored in a storage device of the media unit 106. In some examples, the metadata is accessed from another location (e.g., from a server via a network). Further, the example media unit 106 is capable of performing dynamic volume adjustment by determining and applying average gain values based on the metadata to adjust the average volume of an audio signal to satisfy a volume threshold. The example media unit 106 is additionally capable of monitoring audio that is being output by the output device 110 to determine the average volume level of audio segments in real time. In the event that an audio signal is not identified as corresponding to media, and/or in the event that metadata including volume information is not available for an audio signal, the example media unit 106 is capable of dynamic range compression to provide compression of the audio signal to achieve a desired volume level. In some examples, the example media unit 106 is included as part of another device in a vehicle (e.g., a car radio head unit). In some examples, the example media unit 106 is implemented as software and is included as part of another device, available either through a direct connection (e.g., a wired connection) or through a network (e.g., available on the cloud). In some examples, the example media unit 106 may be incorporated with the audio amplifier 108 and the output device 110 and may output audio signals itself following processing of the audio signals.

The example audio amplifier 108 of the illustrated example of FIG. 1 is a device that is capable of receiving the audio signal that has been processed by the media unit 106 and performing the appropriate amplification of the signal for output by the output device 110. In some examples, the audio amplifier 108 may be incorporated into the output device 110. In some examples, the audio amplifier 108 amplifies the audio signal based on an amplification output value from the media unit 106. In some examples, the audio amplifier 108 amplifies the audio signal based on an input from a listener (e.g., a passenger or driver in a vehicle adjusting a volume selector).

The example output device 110 of the illustrated example of FIG. 1 is a speaker. In some examples, the output device 110 may be multiple speakers, headphones, or any other device capable of presenting audio signals to a listener. In some examples, the output device 110 may be capable of outputting visual elements as well (e.g., a television with speakers).

While the illustrated example system 100 of FIG. 1 is described in reference to a dynamic volume adjustment implementation in a vehicle, some or all of the devices included in the example system 100 may be implemented in any environment, and in any combination. For example, the system 100 may be in an entertainment room of a house, wherein the media devices 102, 104 may be gaming consoles, virtual reality devices, set top boxes, or any other devices capable of accessing and/or transmitting media. Additionally, in some examples, the media may include visual elements as well (e.g., television shows, films, etc.).

Figure 2:
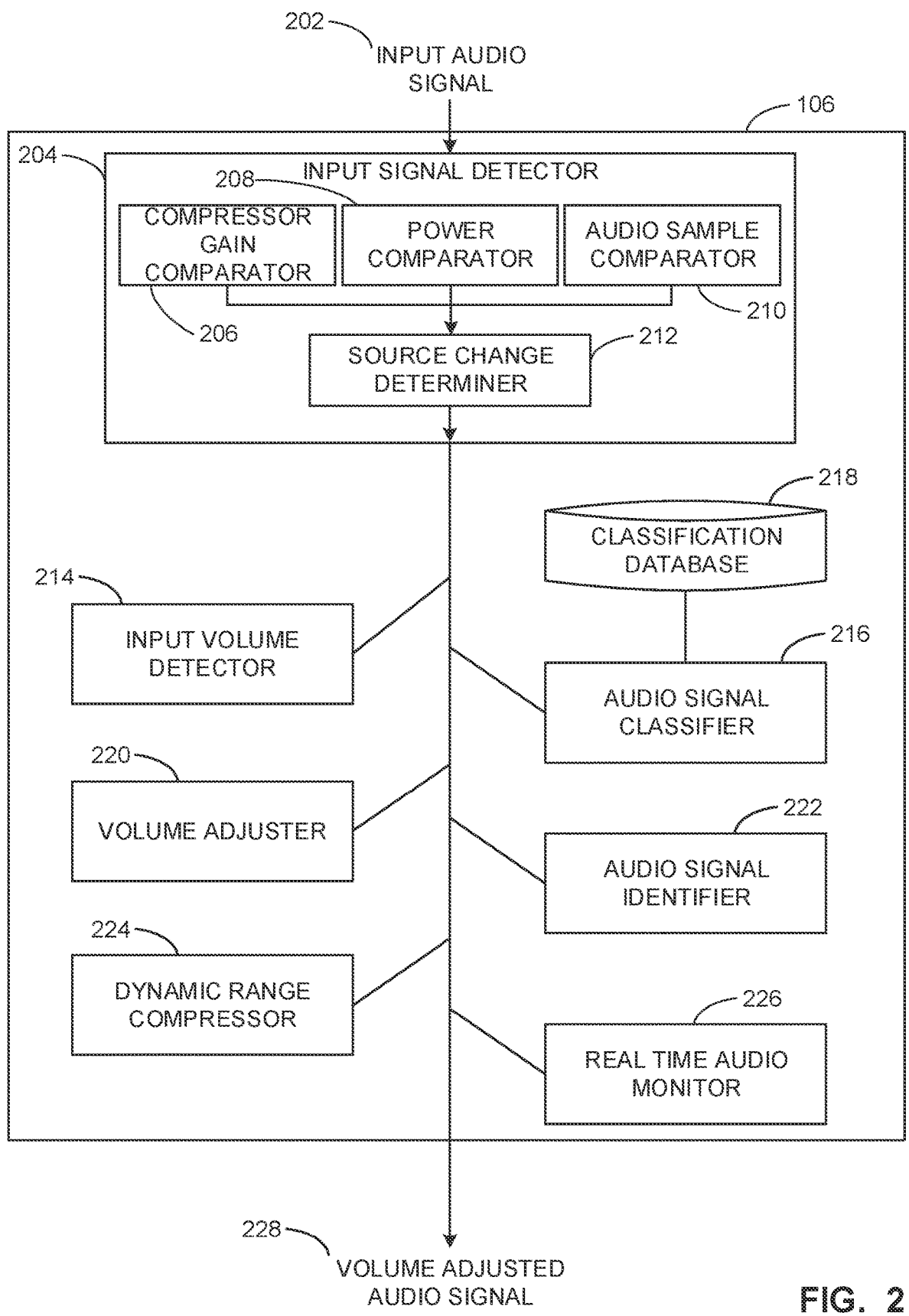
FIG. 2 a block diagram showing additional detail of the media unit of FIG. 1.

FIG. 2 is a block diagram 200 providing additional detail of an example implementation of the media unit 106 illustrated in FIG. 1. The example media unit 106 is capable of receiving an audio signal and processing the audio signal to dynamically adjust the volume of the audio signal to be within a target volume range. Following the dynamic volume adjustment, the example media unit 106 transmits a volume adjusted audio signal 228 to the audio amplifier 108 for amplification prior to output by the output device 110.

The example media unit 106 includes an example input audio signal 202, an example input signal detector 204. This signal detector includes an example compressor gain comparator 206, an example audio volume/power comparator 208, an example audio sample comparator 210, all of which are used to make a determination of whether or not the audio source change has changed 212. The example media unit 106 further includes an example input volume detector 214, an example audio signal classifier 216, an example classification database 218, an example volume adjuster 220, an example audio signal identifier 222, an example dynamic range compressor 224, and an example real time audio monitor 226. The resulting output from the system, is an example volume adjusted audio signal 228.

The example input audio signal 202 is an audio signal that is to be processed and output for presentation. The input audio signal 202 may be accessed from a radio signal (e.g., an FM signal, an AM signal, a satellite radio signal, etc.), from a compact disc, from an auxiliary cable (e.g., connected to a media device), from a Bluetooth signal, from a Wi-Fi signal, or from any other medium. The input audio signal 202 is accessed by the input signal detector 204, the audio signal classifier 216 and/or by the real time audio monitor 226. The input audio signal 202 is transformed by the volume adjuster 220 and/or the dynamic range compressor 224.

The example input signal detector 204 detects the input audio signal 202. In some examples, the input signal detector 204 detects whether the input audio signal 202 is associated with a new input audio signal, or a new input audio signal source (e.g., an AM signal switching to an FM signal, an auxiliary device signal switching to a CD, etc.). In some examples, the input signal detector 204 detects the input audio signal 202 when it begins after the media unit 106 was in an off state (e.g., the media unit 106 is powered on and the input audio signal 202 begins). In some examples, the input signal detector 204 communicates with the audio signal classifier 216 to initiate a classification process when the input audio signal 202 is new (e.g., it represents a new type of input audio signal indicating a change input, it represents a signal that begin after the media unit previously presenting no audio signal, etc.). In some examples, the input signal detector 204 determines if an audio source has changed. For example, the input signal detector 204 can determine if an audio input source has changed via the example compressor gain comparator 206, the example volume/power comparator 208, and the example audio sample comparator 210, which is used by the example source change determiner to determine whether the audio source signal has changed 212.

The example compressor gain comparator 206 compares the current gain of the dynamic range compressor 224 to a previous gain of the dynamic range compressor 224. For example, the compressor gain comparator 206 can compare the gain of the dynamic range compressor 224 associated with a current sample block of the input audio signal 202 to an average (e.g., mean, median, etc.) gain of dynamic range compressor 224 associated with a previous sample block (e.g., the previous three seconds of samples, the previous five seconds of samples, the previous 10 seconds of samples, etc.). In some examples, the compressor gain comparator 206 can output a ratio of the current gain of the dynamic range compressor 224 to the average of the previous gain of dynamic range compressor 224. In other examples, the compressor gain comparator 206 can output any other suitable value associated with the comparison of the current gain of the dynamic range compressor 224 to the average of the previous dynamic gain of the dynamic range compressor 224 (e.g., a difference, etc.).

The example volume/power comparator 208 compares the current power of the input audio signal 202 to a previous power of the input audio signal 202. For example, the power comparator 208 can compare the current power of the input audio signal 202 to an average (e.g., mean, median, etc.) power of the input audio signal 202 associated with a previous sample block (e.g., the previous three seconds of samples, the previous five seconds of samples, the previous 10 seconds of samples, etc.). In some examples, the power comparator 208 can compare the root mean square (RMS) power of the current sample of the input audio signal 202 to the RMS power(s) associated with previous samples of the input audio signal 202. In some examples, the power comparator 208 can query a peak output of the media unit 106 to determine the RMS power of an audio sample. In some examples, the power comparator 208 can output a ratio of the current RMS power to the average of the previous RMS power(s) after K-weighting has been applied. In other examples, the power comparator 208 can output any other suitable value associated with the comparison of the current RMS power of the input audio signal 202 to the average of the previous RMS power(s) of the input audio signal 202 (e.g., a difference, etc.).

The example audio sample comparator 210 compares the current value of a sample of the input audio signal 202 to a previous value of the input audio signal 202. In some examples, the audio sample comparator 210 determines the value of the audio sample based on the maximum amplitude of the samples from the current block of the input audio signal 202. In some examples, the audio sample comparator 210 determines the value of an audio sample as a normalized value (e.g., between 1 and −1, etc.). In other examples, the audio sample comparator 210 can determine the value of the audio sample based on any suitable scale. In some examples, the audio sample comparator 210 determines the absolute value of the determined audio sample value. For example, the audio sample comparator 210 can compare the current maximum audio sample value of the input audio signal 202 to an average (e.g., mean, median, etc.) audio sample value of the input audio signal 202 associated with a previous sample block (e.g., the previous three seconds of samples, the previous five seconds of samples, the previous 10 seconds of samples, etc.). In some examples, the audio sample comparator 210 can output a ratio of the current maximum audio sample value to the average of the previous audio sample block. In other examples, the audio sample comparator 210 can output any other suitable value associated with the comparison of the current audio sample of the input audio signal 202 to the average of the previous audio sample block of the input audio signal 202 (e.g., a difference, etc.).

The example source change determiner 212 determines if the audio source of the input audio signal 202 has changed based on output(s) of the example compressor gain comparator 206, the example power comparator 208, and/or the example audio sample comparator 210. For example, the source change determiner 212 can use regression analysis (e.g., linear regression, binominal regression, least squares, logistic regression, etc.) to determine if a source change has occurred. In such examples, the source change determiner 212 can further base the regression analysis based on labeled input data. For example, the labeled input data can include an indication if the audio source has changed by making a binary decision of source change or no source change, as a result of classification from the values corresponding to a power comparison, a compressor gain comparison, and/or an audio sample comparison. In other examples, the source change determiner 212 can use any other suitable predictive model for determining if an audio source change has occurred (e.g., machining learning, a neural network, etc.). In some examples, the source change determiner 212 can output a binary value indicating if a source change has occurred in a time frame (e.g., the previous three seconds, etc.). For example, the source change determiner 212 can output a "0" to indicate a source change has not occurred and can output a "1" to indicate a source change has occurred. In other examples, the source change determiner 212 can output any other suitable indication to indicate an audio source change has occurred.

The example input volume detector 214 determines volume levels associated with the input audio signal 202. In some examples, the input volume detector 214 determines an initial input volume level value associated with the input audio signal 202 when the input signal detector 204 indicates the input audio signal 202 is a new input audio signal. In some examples, the input volume detector 214 provides a volume level to the dynamic range compressor 224 to enable dynamic range compression of the input audio signal 202 when the input audio signal is first received. For example, the input volume detector 214 can provide an initial volume level for the input audio signal 202 to the dynamic range compressor 224, and the dynamic range compressor 224 can then adjust the dynamic range such that a volume level for the input audio signal 202 falls within a target volume range. The input volume detector 214 of the illustrated example determines volume levels at regular intervals (e.g., for three second intervals, for five second intervals, etc.). In some examples, the input volume detector 214 determines an average (e.g., a mean, a median, etc.) volume level for the interval. In some examples, the input volume detector 214 determines a deviation of the volume level for the interval.

Figure 3:
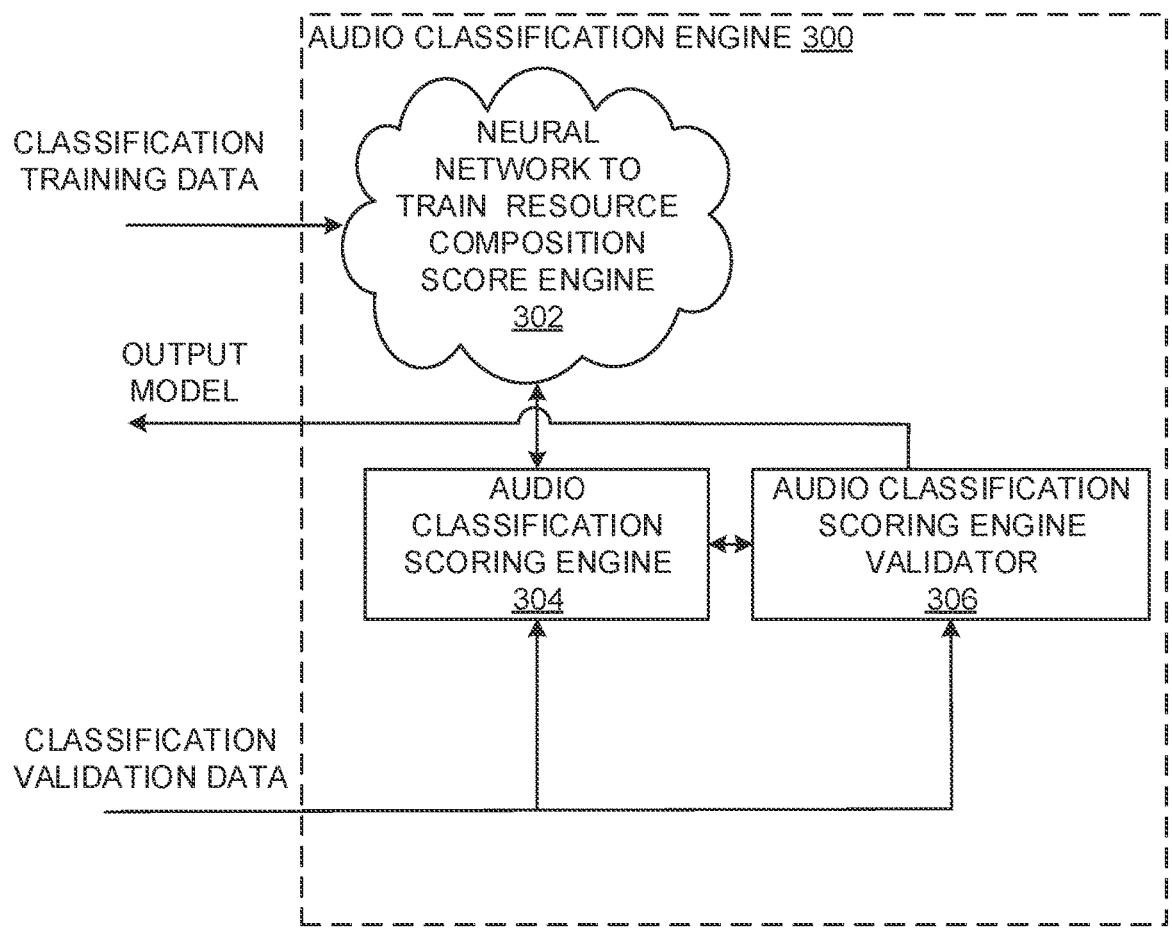
FIG. 3 is a block diagram showing an audio classification engine capable of providing a trained model for use by the media unit of FIGS. 1 and 2.

The example audio signal classifier 216 determines a classification for the input audio signal. In some examples, the audio signal classifier 216 analyzes characteristics of the input audio signal 202 to determine a classification group to which the input audio signal 202 belongs. In some examples, the audio signal classifier 216 utilizes a neural network to aid in the prediction of the dynamic range and inform the volume adjuster 220 of an amount of volume cut to be applied to the input audio signal 202. For example, a neural network may be utilized to train and output a classification model that can be utilized by and/or incorporated into the audio signal classifier 216. A block diagram showing an example audio classification engine capable of providing a trained model for use by the media unit 106 (e.g. by the audio signal classifier 216, etc.) is illustrated in FIG. 3. In some examples, audio characteristics associated with the training data are used by the neural network to identify classification groups is stored in association with the classification groups. For example, audio characteristics such as an average dynamic range, a deviation of dynamic range, an average volume, an average deviation of volume, etc. can be determined for the classification groups, and stored (e.g., in a look-up table) in the classification database 218 and/or at another accessible location.

In some examples, the audio signal classifier 216 and/or the audio classification engine 300 of FIG. 3 accesses volume profiles and/or other representations of a representative variety of audio signals (e.g., representing a variety of instruments, a variety of genres, etc.) and trains a model of the audio signal classifier 216 (e.g., using clustering) to identify classes based on the volume profiles and/or other representations of the representative variety of audio signals. For example, the volume profiles and/or other representations may be clustered based on volume and/or dynamic range. The audio signal classifier 216 can then classify the input audio signal 202 by analyzing the input audio signal 202 to determine a volume, a dynamic range, and/or another property of the input audio signal 202 that can be compared to one or more properties associated with the classes.

The audio signal classifier 216 of the illustrated example determines one or more classification groups from a plurality of classification groups (e.g., nine classification groups, ten classification groups, etc.) associated with various types of audio signals. For example, the classification groups can be associated with genres of music represented by the input audio signal 202, time periods of music represented by the input audio signal 202, different instruments identified in the input audio signal 202, etc. In some examples, classification groups may be associated with spoken content, pop music, rock music, hip hop music, etc. Some example classification groups include, speech, music without drums from before 1975, music without drums from 1976-1995, music without drums from 1996-present, music with synthetic drums from 1976-1995, music with synthetic drums from 1996-present, music with real drums from before 1975, music with real drums from 1976-1995, and/or music with real drums from 1996 to present. Classification groups may therefore correspond to distinct eras of music/sound production in which technological differences in sound recording and/or reproduction capabilities corresponded to differences in volume and/or dynamic range of the produced music/sound. Classification groups may additionally or alternatively be based on observed (e.g., heuristically derived) characteristics of volume and/or dynamic range of audio content.

The audio signal classifier 216 may utilize any characteristics of the input audio signal 202 to classify the input audio signal 202. For example, the audio signal classifier 216 may use spectral characteristics of the input audio signal 202, constant Q transform (CQT) characteristics for the input audio signal 202, or any other parameters. In some examples, time samples, spectrogram(s), summaries, transformations, and/or descriptions of the audio signal are used as inputs to the audio signal classifier 216. Such characteristics may be input into a neural network model to determine a classification group for the input audio signal. In some examples, the neural network model may be accessed from the classification database 218.

The audio signal classifier 216 of the illustrated example can output a single class (e.g., speech, music with drums from after 1996, etc.) or output a probability distribution associated with multiple classes. In some examples, the audio signal classifier 216 determines the class with the highest probability of corresponding to the audio signal and outputs an indication that the audio signal belongs to this class. In other examples, the audio signal classifier 216 outputs probabilities associated with the audio signal belonging to respective ones of the classes (e.g., a sixty percent chance the audio signal belongs to the "speech" class). In some examples, a threshold percentage may be utilized to determine when a single class is output compared to when a probability distribution is output. For example, if the audio signal classifier 216 identifies that there is a ninety percent chance the audio signal belongs to the speech class, this may exceed a threshold percentage and allow the audio signal classifier 216 to identify the audio signal as belonging to the speech class. In some examples, if the threshold percentage is not satisfied, the probability distribution may be output, or the audio signal classifier 216 may indicate it is not able to identify a class associated with the audio signal.

In response to determining a classification group for the input audio signal 202, the audio signal classifier 216 can select a classification gain value associated with the classification group, which can be communicated to the volume adjuster 220 and/or the dynamic range compressor 224. In some examples, the audio signal classifier 216 accesses the classification gain value from one or more look-up tables associated with the classification group. In some examples, the classification gain value is determined as a combination of values from one or more tables associated with one or more classification groups. For example, if the audio signal classifier 216 outputs a probability distribution indicating probabilities that the audio signal belongs to each of the classification groups, tables associated with each of the groups can be retrieved, and gain values or other adjustment values (e.g., EQ value) can be combined and weighted based on the relative probability of each classification group.

In some examples, the audio signal classifier 216 provides the classification group to the volume adjuster 220 and/or the dynamic range compressor 224, which then access and/or determine adjustment parameters associated with the classification group. In some examples, the audio signal classifier 216 outputs (1) a classification gain value and/or (2) a time period corresponding to a time at which volume levels of the audio should be reanalyzed.

The example classification database 218 is a storage location for data associated with audio signal classification. In some examples, the classification database 218 stores a model (e.g., a neural network model) to be used for classifying audio signals. In some examples, the model is accessed and/or retrieved from the audio classification engine, illustrated and described in further detail in FIG. 3. In some examples, the classification database 218 can store audio signals, audio fingerprints, and/or any other data utilized by the media unit 106. The classification database 218 stores look-up tables or other storage implements including for storing audio parameters associated with classification groups. The example classification database 218 may be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory). The classification database 218 may additionally or alternatively be implemented by one or more double data rate (DDR) memories, such as DDR, DDR2, DDR3, mobile DDR (mDDR), etc. The classification database 218 may additionally or alternatively be implemented by one or more mass storage devices such as hard disk drive(s), compact disk drive(s) digital versatile disk drive(s), etc. While in the illustrated example the classification database 218 is illustrated as a single database, the classification database 218 may be implemented by any number and/or type(s) of databases. Furthermore, the data stored in the classification database 218 may be in any data format such as, for example, binary data, comma delimited data, tab delimited data, structured query language (SQL) structures, etc.

The example volume adjuster 220 of the illustrated example of FIG. 2 adjusts the volume level of an audio signal. In some examples, the example volume adjuster 220 determines a single average gain value that will transform the volume of an audio signal from a known volume value (e.g., as determined by the input volume detector 214) to a desired volume value (e.g., a value around the target volume range). The volume adjuster 220 of the illustrated example communicates with the input volume detector 214 and/or the audio signal classifier 216 to determine a targeted gain value. The volume adjuster 220 calculates the targeted gain based on the classification gain value corresponding to one or more classification groups identified by the audio signal classifier 216 and the input volume level detected by the input volume detector 214 (e.g., by computing an average between the classification gain value and the input volume). In some examples, the volume adjuster 220 applies one or more weights to the classification gain value accessed from the audio signal classifier 216 and the input volume accessed from the input volume detector 214.

In some examples, the volume adjuster 220 resets a gain value that is applied to the audio signal when a change in source is detected (e.g., the source changes from an FM station to an auxiliary input). In some such examples, the volume adjuster 220 sets the gain value to zero and the dynamic range compressor 224 performs compression to adjust the volume of the audio signal to be within the target volume range until the input volume detector 214 and the audio signal classifier 216 provide information on the newly detected audio signal to the volume adjuster 220 to determine a targeted gain value.

The volume adjuster 220 of the illustrated example transitions between different volume adjustments smoothly (e.g., using a smoothing filter, an averaging filter, etc.). In some examples, if the volume adjuster 220 determines a large change in the targeted gain value is required, the volume adjuster 220 transition to the new targeted gain value slowly. Conversely, the volume adjuster 220 may transition between a smaller, less perceptible, change in the targeted gain value more quickly. The volume adjuster 220 of the illustrated example uses a one-pole smoothing filter to transition between targeted gain values.

In some examples, the volume adjuster 220 determines whether updated input volume values from the input volume detector 214 and/or updated classification outputs form the audio signal classifier 216 satisfy a difference threshold relative to prior input volume values and/or prior classification outputs. In some such examples, the volume adjuster 220 only determines a new targeted gain value if the updated input volume values and/or the updated classification outputs satisfy the difference threshold relative to prior values used to calculate the targeted gain value.

The example volume adjuster 220 of the illustrated example applies the targeted gain value to the audio signal to transform the audio signal. In some examples, the volume adjuster 220 performs an initial volume adjustment when the input signal detector 204 detects the input audio signal 202 using a fade-in volume adjustment (e.g., minimizing the volume and then gradually increasing the volume when the new signal is detected). In some examples, the volume adjuster 220 can set an initial volume value based on a prior volume value for the type of input signal that is being accessed. For example, if the input audio signal 202 is an FM audio signal, the volume adjuster 220 can determine the previous volume level utilized for an FM audio signal and set the current initial volume to this value. The volume adjuster 220 may independently adjust the initial volume of the input audio signal 202 or may work in tandem with the dynamic range compressor 224 to adjust the input audio signal 202 when it is first detected.

The example audio signal identifier 222 of the illustrated example of FIG. 2 identifies media corresponding to the input audio signal 202. In some examples, the media unit 106 may not include the audio signal identifier 222, and may modify the input audio signal 202 based solely off the classification by the audio signal classifier 216. In some examples, the audio signal identifier 222 performs a comparison of a media identifier (e.g., a fingerprint) embedded in an audio signal with known or reference audio signatures to determine media of the audio signal. In some examples, the example audio signal identifier 222 is able to find a matching reference media identifier. In such examples, the audio signal identifier 222 may pass the identification information to the volume adjuster 220 and/or to the dynamic range compressor 224 to adjust the input audio signal 202 that are specific to the media included in the input audio signal 202. In some examples, the audio signal identifier 222 may interact with an external database (e.g., at a central facility) to find a matching reference signature. In some examples, the audio signal identifier 222 may interact with an internal database (e.g., the classification database 218, etc.) to find a matching reference signature.

The example dynamic range compressor 224 of the illustrated example of FIG. 2 is capable of compressing the input audio signal 202. In some examples, the dynamic range compressor 224 performs audio compression such that the input audio signal 202 has an average volume level that satisfies the target volume threshold (e.g., associated with a desired volume level). In some examples, the dynamic range compressor 224 is continually active, and performs compression of the input audio signal 202 after any volume adjustments made by the volume adjuster 220 to bring the input audio signal 202 to within a target volume threshold (e.g., within +/−0.5 dbFS of −21 dbFS). In some examples, the dynamic range compressor 224 acts as a final step in ensuring that the input audio signal 202 is adjusted to fall within the target volume threshold. In some examples, the amount of dynamic range compression that is performed on the input audio signal 202 is inversely proportional to the output quality of the volume adjusted audio signal 228 (e.g., more dynamic volume compression results in the volume adjusted audio signal 228 having lower quality, such as having more loss).

The example real time audio monitor 226 of the illustrated example of FIG. 2 collects real time volume measurement data. For example, the real time audio monitor 226 may determine the current audio volume level as an average over a time period (e.g., 750 ms). In some examples, the real time audio monitor 226 continually monitors the input audio signal 202 for a monitoring duration (e.g., ten seconds, one minute, etc.). In such examples, the real time audio monitor 226 may analyze the volume level during the monitoring duration to determine whether subsequent adjustments, either by the volume adjuster 220 or by the dynamic range compressor 224, are necessary. In some examples, the real time audio monitor 226 continually monitors the input audio signal 202 for the duration of the input audio signal 202. In some examples, the real time audio monitor 226 determines whether an average volume level over a time period (e.g., 750 ms) falls within the target volume range (e.g., within +/−0.5 dbFS of −21 dbFS). In response to the volume level not falling within the target volume range, the audio signal classifier 216 may attempt to reanalyze the characteristics of the input audio signal 202 to reclassify the input audio signal 202. In some examples, the volume adjuster 220 and/or the dynamic range compressor 224 further adjust the input audio signal 202 in response to the real time audio monitor 226 determining the average volume level over a time period does not fall within the target volume range.

The real time audio monitor 226 of the illustrated example includes and/or accesses a timer to determine whether a duration since a previous classification output by the audio signal classifier 216 satisfies an update time threshold. In some examples, the update time threshold is configured by an operator. For example, the real time audio monitor 226 may be configured with an update time threshold of three seconds, meaning that the audio signal classifier 216 is to re-classify the audio signal in three second intervals (e.g., every three seconds, perform a classification process on the past three seconds). Additionally or alternatively, the input volume detector 214 of the illustrated example determines an input volume (e.g., an average input volume) of the audio signal for the duration since the last classification and/or since the last input volume calculation (e.g., three seconds, the previously example). In some such examples, after re-classifying the audio signal and/or determining a new input volume, the volume adjuster 220 can determine a new targeted gain value based on the new classification and/or the new input volume.

Figure 4:
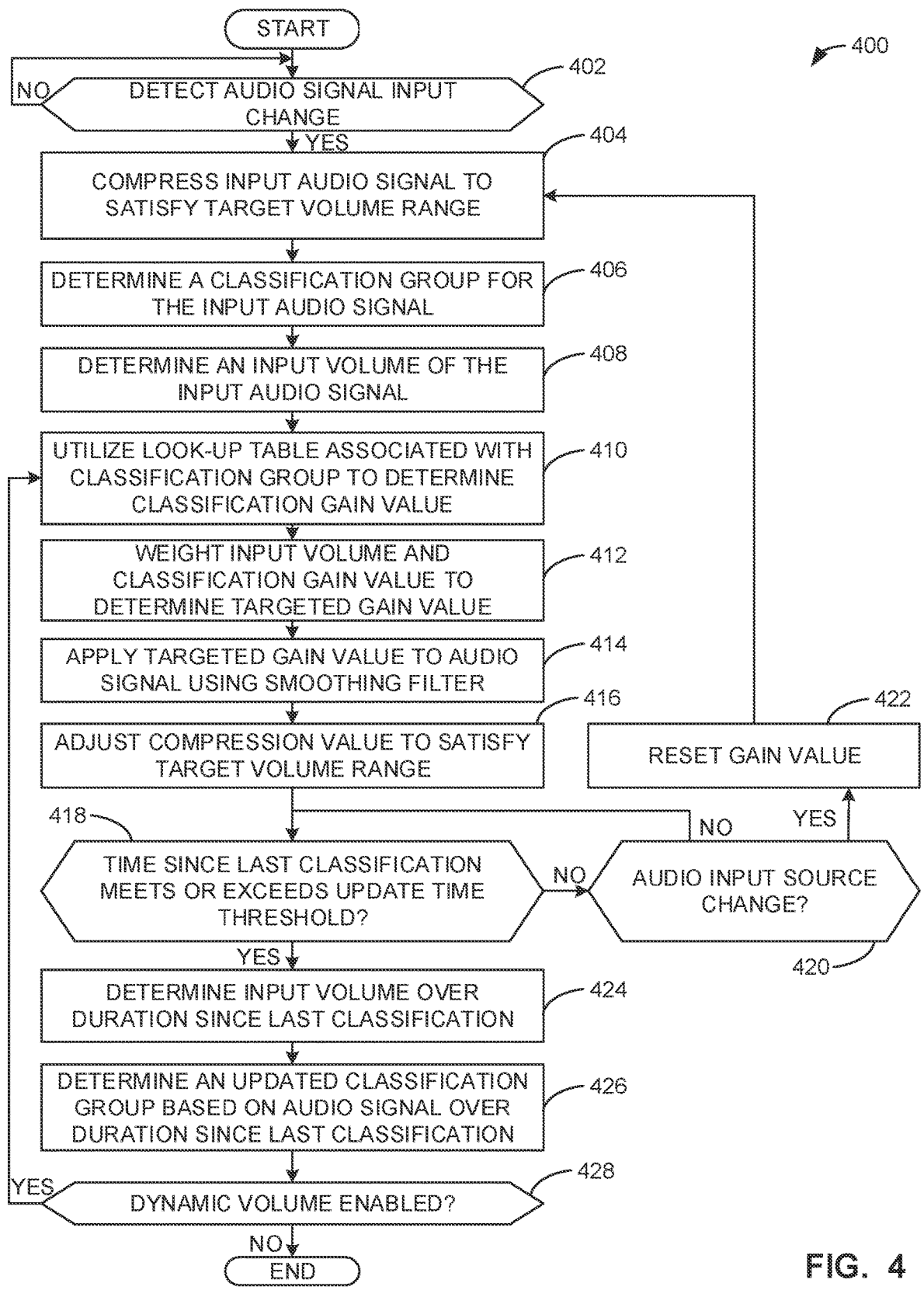
FIGS. 4-5 are flowcharts representative of example machine readable instructions that may be used to implement the media unit 106 of FIGS. 1 and 2 to perform dynamic volume adjustment via audio classification.

While an example manner of implementing the media unit 106 of FIG. 2 is illustrated in FIG. 4, one or more of the elements, processes and/or devices illustrated in FIG. 2 may be combined, divided, re-arranged, omitted, eliminated and/or implemented in any other way. Further, the example input signal detector 204, the example compressor gain comparator 206, the example volume/power comparator 208, and the example audio sample comparator 210 which are used by the example source change determine 212, the example input volume detector 214, the example audio signal classifier 216, the example classification database 218, the example volume adjuster 220, the example audio signal identifier 222, the example dynamic range compressor 224, the example real time audio monitor 226, and/or, more generally, the example media unit 106 of FIG. 2 may be implemented by hardware, software, firmware and/or any combination of hardware, software and/or firmware. Thus, for example, any of the example input signal detector 204, the example compressor gain comparator 206, the example volume/power comparator 208, and the example audio sample comparator 210 which are used by the example source change determiner 212, the example input volume detector 214, the example audio signal classifier 216, the example classification database 218, the example volume adjuster 220, the example audio signal identifier 222, the example dynamic range compressor 224, the example real time audio monitor 226 and/or, more generally, the example media unit 106 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example input signal detector 204, the example compressor gain comparator 206, the example volume/power comparator 208, and the example audio sample comparator 210, which are used by the example source change determine 212, the example input volume detector 214, the example audio signal classifier 216, the example classification database 218, the example volume adjuster 220, the example audio signal identifier 222, the example dynamic range compressor 224, the example real time audio monitor 226 and/or, more generally, the example media unit 106 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example media unit 106 of FIG. 1 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

FIG. 3 is a block diagram showing an audio classification engine 300 capable of providing a trained model for use by the media unit 106 of FIGS. 1 and 2. Machine learning techniques, whether deep learning networks or other experiential/observational learning system, can be used to optimize results, locate an object in an image, understand speech and convert speech into text, and improve the relevance of search engine results, for example. While many machine learning systems are seeded with initial features and/or network weights to be modified through learning and updating of the machine learning network, a deep learning network trains itself to identify "good" features for analysis. Using a multilayered architecture, machines employing deep learning techniques can process raw data better than machines using conventional machine learning techniques. Examining data for groups of highly correlated values or distinctive themes is facilitated using different layers of evaluation or abstraction.

Machine learning techniques, whether neural networks, deep learning networks, and/or other experiential/observational learning system(s), can be used to generate optimal results, locate an object in an image, understand speech and convert speech into text, and improve the relevance of search engine results, for example. Deep learning is a subset of machine learning that uses a set of algorithms to model high-level abstractions in data using a deep graph with multiple processing layers including linear and non-linear transformations. While many machine learning systems are seeded with initial features and/or network weights to be modified through learning and updating of the machine learning network, a deep learning network trains itself to identify "good" features for analysis. Using a multilayered architecture, machines employing deep learning techniques can process raw data better than machines using conventional machine learning techniques. Examining data for groups of highly correlated values or distinctive themes is facilitated using different layers of evaluation or abstraction.

For example, deep learning that utilizes a convolutional neural network (CNN) segments data using convolutional filters to locate and identify learned, observable features in the data. Each filter or layer of the CNN architecture transforms the input data to increase the selectivity and invariance of the data. This abstraction of the data allows the machine to focus on the features in the data it is attempting to classify and ignore irrelevant background information.

Deep learning operates on the understanding that many datasets include high level features which include low level features. While examining an image, for example, rather than looking for an object, it is more efficient to look for edges which form motifs which form parts, which form the object being sought. These hierarchies of features can be found in many different forms of data.

Learned observable features include objects and quantifiable regularities learned by the machine during supervised learning. A machine provided with a large set of well classified data is better equipped to distinguish and extract the features pertinent to successful classification of new data.

A deep learning machine that utilizes transfer learning can properly connect data features to certain classifications affirmed by a human expert. Conversely, the same machine can, when informed of an incorrect classification by a human expert, update the parameters for classification. Settings and/or other configuration information, for example, can be guided by learned use of settings and/or other configuration information, and, as a system is used more (e.g., repeatedly and/or by multiple users), a number of variations and/or other possibilities for settings and/or other configuration information can be reduced for a given situation.

An example deep learning neural network can be trained on a set of expert classified data, for example. This set of data builds the first parameters for the neural network, and this would be the stage of supervised learning. During the stage of supervised learning, the neural network can be tested whether the desired behavior has been achieved.

Once a desired neural network behavior has been achieved (e.g., a machine has been trained to operate according to a specified threshold, etc.), the machine can be deployed for use (e.g., testing the machine with "real" data, etc.). During operation, neural network classifications can be confirmed or denied (e.g., by an expert user, expert system, reference database, etc.) to continue to improve neural network behavior. The example neural network is then in a state of transfer learning, as parameters for classification that determine neural network behavior are updated based on ongoing interactions. In certain examples, the neural network such as the neural network 302 can provide direct feedback to another process, such as an audio classification scoring engine 304, etc. In certain examples, the neural network 302 outputs data that is buffered (e.g., via the cloud, etc.) and validated before it is provided to another process.

In the example of FIG. 3, the neural network 302 receives input from previous outcome data associated with classification training data, and outputs an algorithm to predict classification groups associated with audio signals. The network 302 can be seeded with some initial correlations and can then learn from ongoing experience. In some examples, the neural network 302 continually receives feedback from at least one classification training data. In the example of FIG. 3, throughout the operational life of the audio classification engine 300, the neural network 302 is continuously trained via feedback and the example audio classification scoring engine 304 can be updated based on the neural network 302 and/or additional classification training data as desired. The network 302 can learn and evolve based on role, location, situation, etc.

In some examples, a level of accuracy of the model generated by the neural network 302 can be determined by an example audio classification scoring engine validator 306. In such examples, at least one of the audio classification scoring engine 304 and the audio classification scoring engine validator 306 receive a set of classification training data. Further in such examples, the audio classification scoring engine 304 receives inputs associated with the classification validation data and predicts one or more audio classifications associated with the classification validation data. The predicted outcomes are distributed to the audio classification scoring engine validator 306. The audio classification scoring engine validator 306 additionally receives known audio classifications associated with the classification validation data and compares the known audio classifications with the predicted classifications receives from the audio classification scoring engine 304. In some examples, the comparison will yield a level of accuracy of the model generated by the neural network 302 (e.g., if 95 comparison yield a match and 5 yield an error, the model is 95% accurate, etc.). Once the neural network 302 reaches a desired level of accuracy (e.g., the network 302 is trained and ready for deployment), the audio classification scoring engine validator 306 can output the model to the audio signal classifier 216 of FIG. 2 for use in classifying audio other than the classification training data and/or classification validation data.

Figure 5:
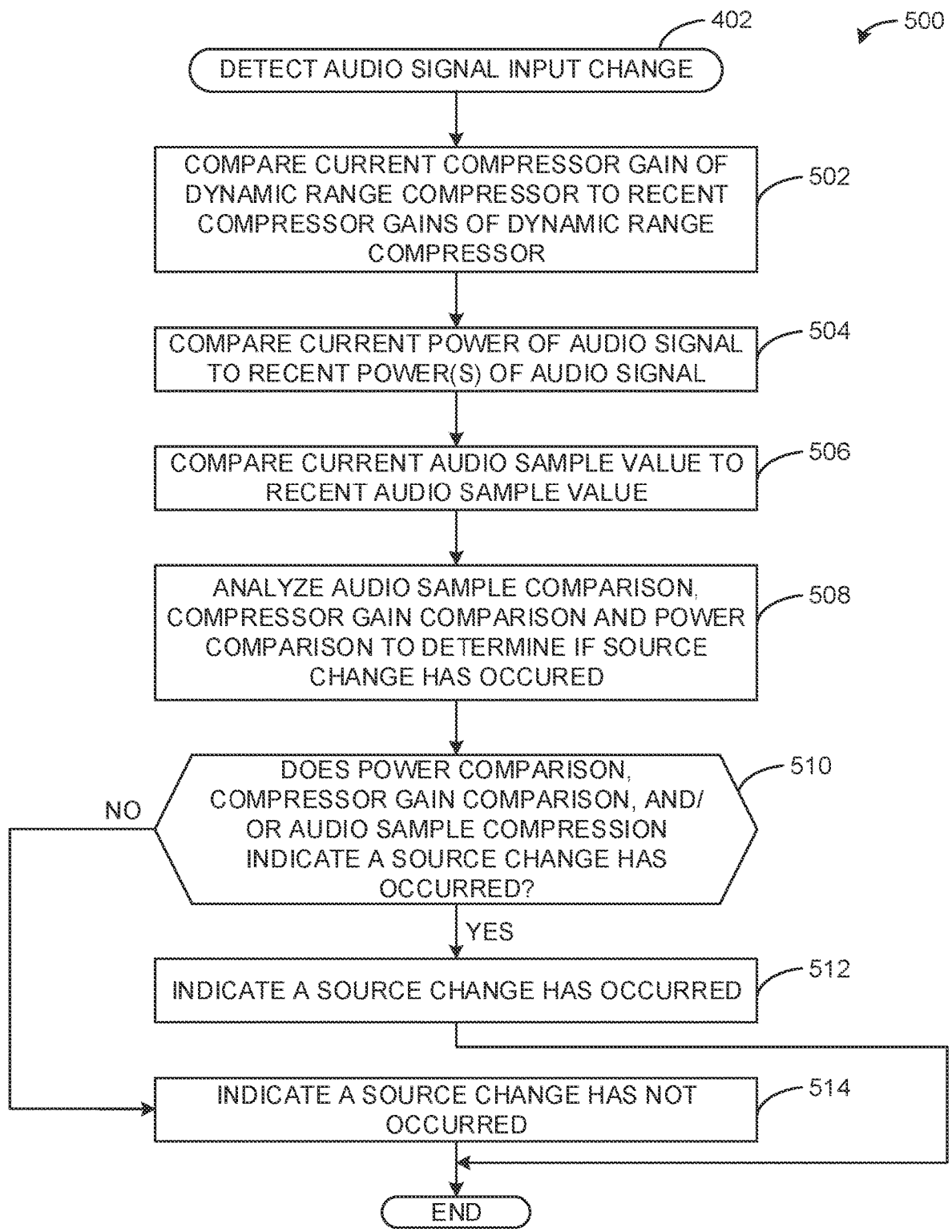

Flowcharts representative of example hardware logic, machine readable instructions, hardware implemented state machines, and/or any combination thereof for implementing the media unit 106 of FIG. 3 are shown in FIGS. 4-5. The machine readable instructions may be an executable program or portion of an executable program for execution by a computer processor such as the processor 612 shown in the example processor platform 600 discussed below in connection with FIG. 6. The program may be embodied in software stored on a non-transitory computer readable storage medium such as a CD-ROM, a floppy disk, a hard drive, a DVD, a Blu-ray disk, or a memory associated with the processor 612, but the entire program and/or parts thereof could alternatively be executed by a device other than the processor 612 and/or embodied in firmware or dedicated hardware. Further, although the example program is described with reference to the flowchart illustrated in FIGS. 4-5, many other methods of implementing the example media unit 106 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 4-5 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

Example machine readable instructions for implementing the media unit 106 of FIGS. 1 and 2 and that may be executed to perform dynamic volume adjustment via audio classification are illustrated in FIGS. 4-5. With reference to the preceding figures and associated descriptions, the example machine readable instructions 400 begin at block 402. At block 402, the example media unit 106 detects an audio signal input change. In some examples, the input signal detector 204 detects an audio signal input change. For example, the audio signal may have begun (e.g., the media unit 106 previously was not accessing any audio signal and a new one has begun) or the audio signal may have been changed (e.g., an FM radio signal was changed to an AM radio signal). The execution of block 402 is discussed in greater detail below in connection with FIG. 5.

At block 404, the example media unit 106 compresses the input audio signal 202 to satisfy the target volume range. In some examples, the dynamic range compressor 224 compresses the input audio signal 202 to satisfy the target volume range.

At block 406, the example media unit 106 determines a classification group for the input audio signal 202. In some examples, the audio signal classifier 216 determines a classification group for the input audio signal. In some examples, the audio signal classifier 216 determines a classification group based a comparison of one or more characteristics (e.g., CQT values) of the input audio signal with a trained machine learning model. The audio signal classifier 216 may additionally or alternatively determine a probability distribution associated with one or more classification groups.

At block 408, the example media unit 106 determines an input volume of the input audio signal 202. In some examples, the input volume detector 214 determines an input volume of the input audio signal 202. In some examples, the input volume detector 214 determines an average input volume of the input audio signal 202 over a period of time (e.g., three seconds, five seconds, etc.). In some examples, the input volume detector 214 determines a deviation of the volume of the input audio signal 202 over a period of time. In some examples, the input volume detector 214 determines one or more instantaneous volume values.

At block 410, the example media unit 106 utilizes a look-up table associated with the classification group for the input audio signal 202 to determine a classification gain value. In some examples, the audio signal classifier 216 a look-up table associated with one or more classification groups determined by the audio signal classifier 216 to be associated with the input audio signal 202 to determine a classification gain value. In some examples, the classification gain value is a single value representative of a classification group (e.g., based on an average dynamic range observed in the training data for the classification group, based on an average volume observed in the training data for the classification group, etc.). In some examples, the classification gain value is determined based on a probability distribution output by the audio signal classifier 216 (e.g., one or more gain values are calculated based on a probability of the input audio signal 202 belonging to one or more of the classification groups).

At block 412, the example media unit 106 weights the input volume and the classification gain value to determine a targeted gain value. In some examples, the volume adjuster 220 applies a first weight to the input volume and a second weight to the classification gain value and subsequently determines a targeted gain value based on the weighted input volume and the weighted classification gain value. In some examples, the volume adjuster 220 applies a greater weight to the input than the classification gain value, as the input volume is indicative of an actual condition of the audio signal as opposed to the prediction of the classification gain value. In some examples, the volume adjuster 220 determines the targeted gain value as a value between the input volume measurement and the target volume range. In some examples, the volume adjuster 220 computes an average between the input volume and the volume level which would result from applying the classification gain value, and the targeted classification gain value is determined as the gain required to bring the volume of the input audio signal 202 to this averaged volume level.

At block 414, the example media unit 106 applies the targeted gain value to the audio signal using a smoothing filter. In some examples, the volume adjuster 220 applies the targeted gain value to the input audio signal 202 using a smoothing filter. The volume adjuster 220 can utilize a different type of filter (e.g., a median filter, a Kalman filter, etc.) to smooth transitions between a first gain value and an updated gain value (e.g., when the classification and/or the input volume is updated), or between no gain value and a gain value (e.g., when a new audio signal is being detected).

At block 416, the example media unit 106 adjusts a compression value to satisfy the target volume range. In some examples, the dynamic range compressor 224 adjusts the compression value to satisfy the target volume range. For example, if the volume adjuster 220 increases a gain value that is applied to the input audio signal 202, the dynamic range compressor 224 may decrease a compression value, as less dynamic range compression is required to bring the input audio signal 202 to within the target volume range. Conversely, if the volume adjuster 220 decreases a gain value that is applied to the input audio signal 202, the dynamic range compressor 224 may increase a compression value, as more dynamic range compression is required to bring the input audio signal 202 to within the target volume range.

At block 418, the example media unit 106 determines if a time since the last classification meets or exceeds an update time threshold. In some examples, the real time audio monitor 226 determines if a time since the last classification was performed meets or exceeds the update time threshold. In some examples, the real time audio monitor 226 determines if a time since the last input volume calculation was taken, and/or a time since the last volume adjustment was performed by the volume adjuster 220, meets or exceeds the update time threshold. In response to the time since the last classification meeting or exceeding the update time threshold, processing transfers to block 424. Conversely, in response to the time since the last classification not meeting or exceeding the update time threshold, processing transfers to block 420.

At block 420, the example media unit 106 determines if an audio input source change has occurred. In some examples, the input signal detector 204 determines if an audio input source change has occurred (e.g., the input source has changed from FM radio to an auxiliary input, the input source has changed from a CD to AM radio, etc.). In response to an audio input source change occurring, processing transfers to block 422. Conversely, in response to no audio input source change occurring, processing transfers to block 418. The execution of block 420 is discussed in greater detail below in connection with FIG. 5.

At block 422, the example media unit 106 resets the gain value. In some examples, the volume adjuster 220 resets the gain value. For example, the volume adjuster 220 can set the gain value to zero, as the prior targeted gain value (determined for a prior audio signal from a different input source) may no longer be effective for the new audio signal. Therefore, until a new targeted gain value is determined (e.g., following classification and input volume determination), the gain value is reset to one and the dynamic range compressor 224 compresses the input audio signal 202 to satisfy the target volume range.

At block 424, the example media unit 106 determines an input volume over the duration since the last classification.

In some examples, the input volume detector 214 determines an input volume over the duration since the last classification. For example, if the real time audio monitor 226 is configured with a three second update interval, once the full duration of the update interval has elapsed (e.g., at Block 418), the input volume detector 214 determines the input volume for the update interval. In some examples, an average input volume is determined for the update interval.

At block 426, the example media unit 106 determines an updated classification group based on the audio signal over the duration since the last classification. In some examples, the audio signal classifier 216 determines an updated classification group based on the audio signal over the duration since the last classification. For example, if the real time audio monitor 226 is configured with a three second update interval, once three seconds have elapsed since the last classification, the audio signal classifier 216 analyzes one or more characteristics of the audio signal to determine an updated classification group. In some examples, the updated classification group is the same as the previously determined classification group.

At block 428, the example media unit 106 determines if dynamic volume is enabled. For example, an operator of the media unit 106 can enable or disable dynamic volume (e.g., via a switch, via a setting on the media unit 106, etc.). In response to dynamic volume being enabled, processing transfers to block 410. Conversely, in response to dynamic volume not being enabled, processing terminates.

FIG. 5 is a flowchart illustrating an example process 500 for the execution of blocks 402 and/or block 420 of FIG. 4. The example process 500 begins at block 502. At block 502, the compressor gain comparator 206 compares the current compressor gain to recent past compressor gains. For example, the compressor gain comparator 206 can compare the gain of the dynamic range compressor 224 associated with a current sample of the input audio signal 202 to an average (e.g., mean, median, etc.) gain of dynamic range compressor 224 associated with a previous sample block (e.g., the previous three seconds of samples, the previous five seconds of samples, the previous 10 seconds of samples, etc.). In some example, the compressor gain comparator 206 can output a ratio of the current gain of the dynamic range compressor 224 associated with a current sample block of the input audio signal 202 to an average (e.g., mean, median, etc.) gain of dynamic range compressor 224 associated a previous sample block (e.g., the previous three seconds of samples, the previous five seconds of samples, the previous 10 seconds of samples, etc.).

At block 504, the power comparator 208 compares the current volume/power of the input audio signal 202 to recent past volume/power(s) of audio signals. For example, the power comparator 208 can compare the current RMS power of the input audio signal 202 to an average (e.g., mean, median, etc.) power of the input audio signal 202 associated with a previous sample block (e.g., the previous three seconds of samples, the previous five seconds of samples, the previous 10 seconds of samples, etc.). In some examples, the power comparator 208 can query a peak meter output to determine the RMS power. In some examples, the power comparator 208 can output a ratio of the current RMS power to the average of the previous RMS power(s).

At block 506, the audio sample comparator 210 compares the current audio sample block's maximum value to recent audio sample value(s). For example, the audio sample comparator 210 can compare the current audio sample value of the input audio signal 202 to an average (e.g., mean, median, etc.) audio sample value of the input audio signal 202 associated with a previous sample block (e.g., the previous three seconds of samples, the previous five seconds of samples, the previous 10 seconds of samples, etc.). In some examples, the audio sample comparator 210 can output a ratio of the current audio sample value to the average of the previous sample block.

At block 508, the source change determiner 212 analyzes the audio sample comparison, compressor gain comparison, and power comparison to determine if a source change has occurred. For example, the source change determiner 212 can use regression analysis (e.g., linear regression, binominal regression, least squares, logistic regression, etc.) to determine if a source change has occurred. In other examples, the source change determiner 212 can use any other suitable means for determining if a source change has occurred (e.g., a neural network, etc.).

At block 510, the source change determiner 212 determines if the RMS comparison, compressor gain comparison and/or audio sample compression indicates a source change has occurred. If the source change determiner 212 determines the RMS comparison, compressor gain comparison and/or audio sample compression indicates a source change has occurred via logistic regression or other classification methods, the process 500 advances to block 512. If the source change determiner 212 determines the RMS comparison, compressor gain comparison and/or audio sample compression indicates a source change has not occurred, the process 500 advances to block 514.

At block 512, the source change determiner 212 indicates a source change has occurred. For example, the source change determiner 212 can cause the input signal detector 204 to indicate to the media unit 106 to that a source change has occurred.

At block 514, the source change determiner 212 indicates a source change has not occurred. For example, the source change determiner 212 can cause the input signal detector 204 to indicate to the media unit 106 to that a source change has not occurred. The process 500 then ends.

Figure 6:
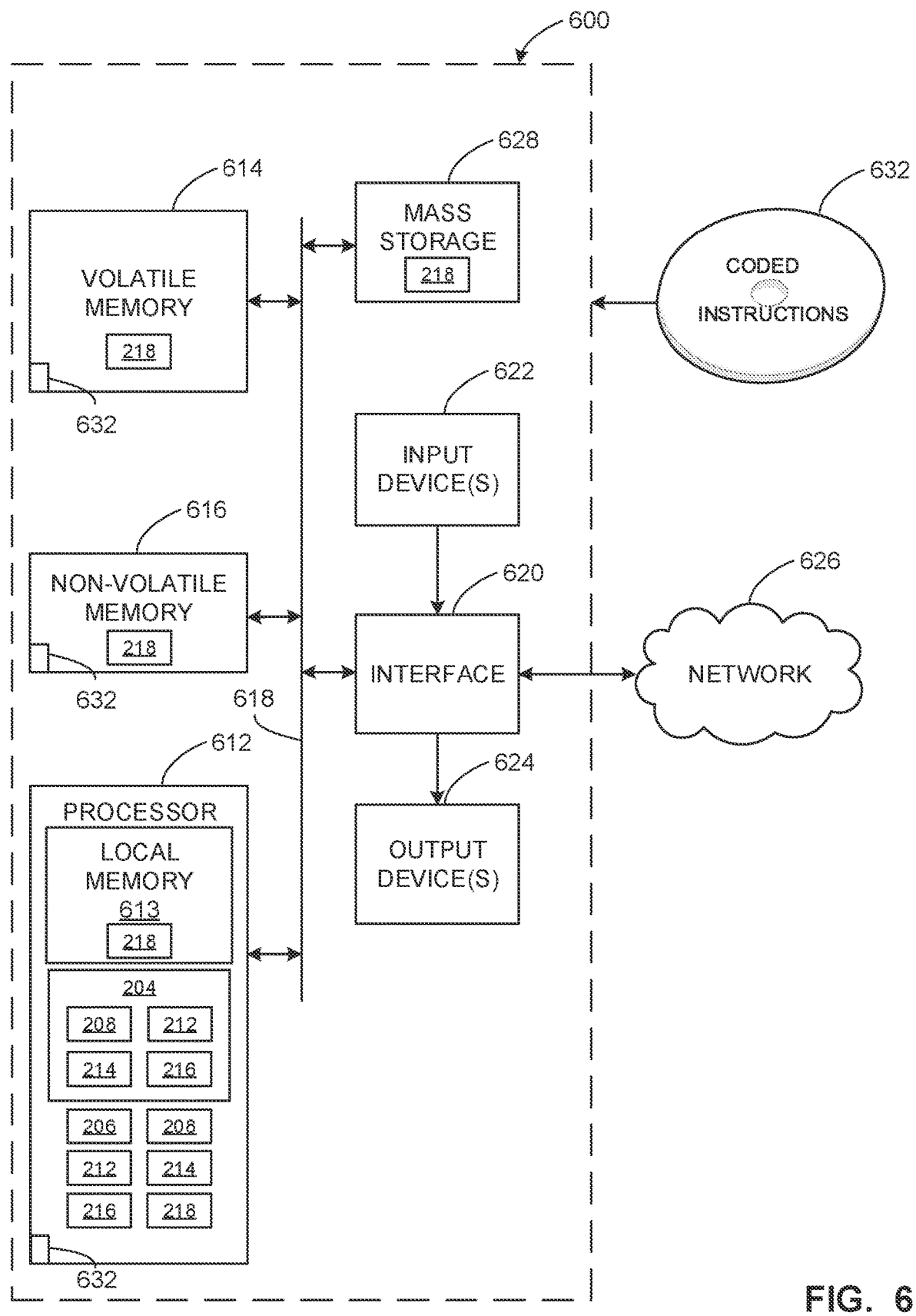
FIG. 6 is a schematic illustration of an example processor platform that may execute the instructions of FIGS. 4-5 to implement the example media unit 106 of FIGS. 1 and 2.

FIG. 6 is a block diagram of an example processor platform 600 structured to execute the instructions of FIG. 4 to implement the media unit 106 of FIGS. 1-2. The processor platform 600 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 600 of the illustrated example includes a processor 612. The processor 612 of the illustrated example is hardware. For example, the processor 612 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example input signal detector 204, the example compressor gain comparator 206, the example volume/power comparator 208, and the example audio sample comparator 210, which is used by the example source change determiner 212, the example input volume detector 214, the example audio signal classifier 216, the example classification database 218, the example volume adjuster 220, the example audio signal identifier 222, the example dynamic range compressor 224, the example real time audio monitor 226 and/or, more generally, the example media unit 106 of FIG. 2.

The processor 612 of the illustrated example includes a local memory 613 (e.g., a cache). The processor 612 of the illustrated example is in communication with a main memory including a volatile memory 614 and a non-volatile memory 616 via a bus 618. The volatile memory 614 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 616 may be implemented by flash memory and/or any other desired type of memory device. Access to the main memory 614, 616 is controlled by a memory controller.

The processor platform 600 of the illustrated example also includes an interface circuit 620. The interface circuit 620 may be implemented by any type of interface standard, such as an Ethernet interface, a universal serial bus (USB), a Bluetooth® interface, a near field communication (NFC) interface, and/or a PCI express interface.

In the illustrated example, one or more input devices 622 are connected to the interface circuit 620. The input device(s) 622 permit(s) a user to enter data and/or commands into the processor 1012. The input device(s) can be implemented by, for example, an audio sensor, a microphone, a camera (still or video), a keyboard, a button, a mouse, a touchscreen, a track-pad, a track-ball, isopoint and/or a voice recognition system.

One or more output devices 624 are also connected to the interface circuit 620 of the illustrated example. The output devices 1024 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 620 of the illustrated example, thus, typically includes a graphics driver card, a graphics driver chip and/or a graphics driver processor.

The interface circuit 620 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 626. The communication can be via, for example, an Ethernet connection, a digital subscriber line (DSL) connection, a telephone line connection, a coaxial cable system, a satellite system, a line-of-site wireless system, a cellular telephone system, etc.

The processor platform 600 of the illustrated example also includes one or more mass storage devices 628 for storing software and/or data. Examples of such mass storage devices 628 include floppy disk drives, hard drive disks, compact disk drives, Blu-ray disk drives, redundant array of independent disks (RAID) systems, and digital versatile disk (DVD) drives.

The machine executable instructions 632 of FIG. 4 may be stored in the mass storage device 628, in the volatile memory 614, in the non-volatile memory 616, and/or on a removable non-transitory computer readable storage medium such as a CD or DVD.

From the foregoing, it will be appreciated that example methods, apparatus and articles of manufacture have been disclosed that adjust the volume of media such that media with different characteristics can be played at approximately the same volume, while minimizing the amount of compression that is required to achieve this volume. While conventional implementations of volume equalization rely solely on compression and consequently cause perceptible changes to the audio signal, examples disclosed herein enable intelligently classify audio signals and determine an average gain value based a classification associated with the audio signal, discerning, for example, between audio signals with relatively small dynamic range which can be drastically altered with a gain value, and those with larger dynamic ranges, which may require more compression. Example techniques disclosed herein utilizing a combination of an input volume measurement and parameters associated with a classification of the audio signal to intelligently adjust the volume of an input audio signal in real time. Examples disclosed herein describe techniques to continually adjust volume levels in the event that the volume adjustment needs to be corrected after the initial analysis (e.g., due to a change in the classification of the audio signal, a change in the observed input volume, etc.). Example techniques disclosed herein further include techniques to initially adjust a volume level of an audio signal following an audio signal input change. Such techniques are advantageous over conventional implementations since they are imperceptible to users and enable different media from different or similar sources to be played at substantially the same volume for a seamless media presentation experience.

In some examples, an example audio dynamic range compressor can be always active to bring the signal down to a particular range (e.g., −21 dbFS) as in the current Dynamic Volume. In other examples, the audio dynamic range compressor can be active for a portion of time.

In some examples, an example real time volume detector can be applied on the input to gauge the current average level over one or more intervals (e.g., 750 ms intervals) as with the current Dynamic Volume. In such examples, the current average level can now be used as an initial and ongoing guess to guide how much the volume can be decreased by.

In some examples, a neural network based classifier can also assist in the prediction of the dynamic range and will inform a volume decrease that can be applied. This can initially be based on the current category classifiers (e.g., 9 classifiers, 15 classifiers, etc.) with potential improvements. In some examples, increasing the quantity of current category classifiers could facilitate a more accurate dynamic range predictor that uses a different real time feature and neural network approach. In each example, an accuracy associated with the quantity the volume can be decreased may be increased.

In some examples, the goal is to decrease the volume to something closer to a particular level (e.g., −12 dbFS) that the compressor can arrive at. Once the amount of decrease is determined, a single pole smoothing filter can be used to go from the current full volume at the input down to the amount that is determined. The compressor will continue to hold the volume at a particular level (e.g., −21 dbFS) on average, but the amount that it has to knock the input down by can become smaller as the amount is decreased to the target.

In a described example of an operation of the methods, apparatus, and systems disclosed herein, fully normalized and loud pop music can be distributed via an input. The compressor can move the 0.0 dbFS material down to −21 dbFS. Substantially in parallel, the input volume detector determines that the input is running at −1 dbFS on average, and the classifier determines that Music with Synthetic Drums and Bass from 1996 to Present is presented. This category yields a cut amount of −15 dbFS, and the volume detector yields −20 dbFS. The two values are averaged and the signal can be decreased by −17.50 dbFS, and can be decreased by another 3.5 decibels to arrive at the baseline −21 dbFS. Due to the compressor lowering a signal that is 3.5 decibels louder than its threshold (e.g., based on the decreases described above), the audio quality is improved compared to lowering a signal that is 21 decibels above its threshold, which is what would occur if only a compressor is utilized.

Example methods, apparatus, systems, and articles of manufacture to for dynamic volume adjustment via audio classification are disclosed herein. Further examples and combinations thereof include the following: Example 1 includes an apparatus, comprising an audio signal classifier to analyze, with a neural network, a parameter of an audio signal associated with a first volume level to determine a classification group associated with the audio signal, an input volume detector to determine an input volume of the audio signal, a volume adjuster to apply a gain value to the audio signal, the gain value based on the classification group and the input volume, the gain value to modify the first volume level to a second volume level, and a dynamic range compressor to apply a compression value to the audio signal, the compression value to modify the second volume level to a third volume level that satisfies a target volume threshold.

Example 2 includes the apparatus of example 1, further including a source change determiner to determine if a source of the audio signal has changed.

Example 3 includes the apparatus of example 2, wherein the source change determiner determines if the source of the audio signal has changed is based on at least one of (1) a comparison of a current compressor gain associated with the audio signal to a previous compressor gain associated with the audio signal, (2) a comparison of a RMS power associated with the audio signal to a previous RMS power associated with the audio signal, or (3) a comparison of a current audio sample value associated with the audio signal to a previous audio sample value associated with the audio signal.

Example 4 includes the apparatus of example 2, wherein the volume adjuster is further to, in response to determining the source of the audio signal has changed, reset the gain value of the audio signal.

Example 5 includes the apparatus of example 1, wherein the classification group is associated with at least one of a (1) a genre of music represented by the audio signal, (2) a time period of the music represented by the audio signal, or (3) a presence of an instrument in the music represented by the audio signal.

Example 6 includes the apparatus of example 1, wherein the input volume detector is further to determine a fourth volume level over a first time period does not fall within the target volume threshold, the first time period occurring after a second time period, the third volume level associated with the second time period, and the dynamic range compressor is further to adjust the compression value to fifth volume level, the adjusted compression value to modify the fourth volume level to a fifth volume level that satisfies the target volume threshold.

Example 7 includes the apparatus of example 1, wherein the target volume threshold is within five decibels relative to full scale (dBFS) to twenty-one dBFS.

Example 8 includes a non-transitory computer readable storage medium comprising instructions which, when executed, cause a processor to at least analyze, with a neural network, a parameter of an audio signal associated with a first volume level to determine a classification group associated with the audio signal, determine an input volume of the audio signal, apply a gain value to the audio signal, the gain value based on the classification group and the input volume, the gain value to modify the first volume level to a second volume level, and apply a compression value to the audio signal, the compression value to modify the second volume level to a third volume level that satisfies a target volume threshold.

Example 9 includes the non-transitory computer readable storage medium of example 8, wherein the instructions, when executed, cause the processor to determine if a source of the audio signal has changed.

Example 10 includes the non-transitory computer readable storage medium of example 9, wherein the determination of if the source of the audio signal has changed is based on at least one of (1) a comparison of a current compressor gain associated with the audio signal to a previous compressor gain associated with the audio signal, (2) a comparison of a RMS power associated with the audio signal to a previous RMS power associated with the audio signal, or (3) a comparison of a current audio sample value associated with the audio signal to a previous audio sample value associated with the audio signal.

Example 11 includes the non-transitory computer readable storage medium of example 9, wherein the instructions, when executed, cause the processor to, in response to determining the source of the audio signal has changed, reset the gain value of the audio signal.

Example 12 includes the non-transitory computer readable storage medium of example 11, wherein the classification group is associated with at least one of a (1) a genre of music represented by the audio signal, (2) a time period of the music represented by the audio signal, or (3) a presence of an instrument in the music represented by the audio signal.

Example 13 includes the non-transitory computer readable storage medium of example 8, wherein the instructions, when executed, cause the processor to determine a fourth volume level over a first time period does not fall within the target volume threshold, the first time period occurring after a second time period, the third volume level associated with the second time period, and adjust the compression value to fifth volume level, the adjusted compression value to modify the fourth volume level to a fifth volume level that satisfies the target volume threshold.

Example 14 includes the method of example 1, wherein the target volume threshold is within five decibels relative to full scale (dBFS) to twenty-one dBFS.

Example 15 includes a method, comprising analyzing, with a neural network, a parameter of an audio signal associated with a first volume level to determine a classification group associated with the audio signal, determining an input volume of the audio signal, applying a gain value to the audio signal, the gain value based on the classification group and the input volume, the gain value to modify the first volume level to a second volume level, and applying a compression value to the audio signal, the compression value to modify the second volume level to a third volume level that satisfies a target volume threshold.

Example 16 includes the method of example 15, further including determining if a source of the audio signal has changed.

Example 17 includes the method of example 16, wherein the determining if the source of the audio signal has changed is based on at least one of (1) a comparison of a current compressor gain associated with the audio signal to a previous compressor gain associated with the audio signal, (2) a comparison of a RMS power associated with the audio signal to a previous RMS power associated with the audio signal, or (3) a comparison of a current audio sample value associated with the audio signal to a previous audio sample value associated with the audio signal.

Example 18 includes the method of example 16, further including, in response to determining the source of the audio signal has changed, resetting the gain value of the audio signal.

Example 19 includes the method of example 15, wherein the classification group is associated with at least one of a (1) a genre of music represented by the audio signal, (2) a time period of the music represented by the audio signal, or (3) a presence of an instrument in the music represented by the audio signal.

Example 20 includes the method of example 15, further including determining a fourth volume level over a first time period does not fall within the target volume threshold, the first time period occurring after a second time period, the third volume level associated with the second time period, and adjusting the compression value to modify the fourth volume level to a fifth volume level that satisfies the target volume threshold.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A non-transitory machine-readable medium having stored thereon instructions that, when executed, cause one or more processors to perform a set of operations comprising:
analyzing, by a neural network, a parameter of an input audio signal associated with a first input volume level to determine a classification group associated with the input audio signal;
determining an input volume of the input audio signal;
determining a classification gain value based on the classification group;
determining a target gain value as an intermediary value between the input volume and the classification gain value, wherein the target gain value is determined by applying one or more weights to the input volume and the classification gain value; and
generating a gain-adjusted volume by applying the target gain value to the input audio signal.

2. The non-transitory machine-readable medium of claim 1, wherein the target gain value is determined by applying a first weight to the input volume and a second weight to the classification gain value.

3. The non-transitory machine-readable medium of claim 1, wherein the set of operations further comprises applying the intermediary value to the input audio signal, wherein the intermediary value modifies the first input volume level to a second volume level.

4. The non-transitory machine-readable medium of claim 3, wherein the set of operations further comprises applying a compression value to the input audio signal, wherein the compression value modifies the second volume level to a third volume level that satisfies a target volume threshold.

5. The non-transitory machine-readable medium of claim 1, wherein the set of operations further comprises determining if a source of the input audio signal has changed.

6. The non-transitory machine-readable medium of claim 5, wherein determining if the source of the input audio signal has changed is based on at least one of: (1) a comparison of a current compressor gain associated with the input audio signal to a previous compressor gain associated with the input audio signal, (2) a comparison of a RMS power associated with the input audio signal to a previous RMS power associated with the input audio signal, or (3) a comparison of a current audio sample value associated with the input audio signal to a previous audio sample value associated with the input audio signal.

7. The non-transitory machine-readable medium of claim 5, wherein the set of operations further comprises, in response to determining the source of the input audio signal has changed, resetting the intermediary value of the input audio signal.

8. The non-transitory machine-readable medium of claim 1, wherein the classification group comprises at least one of: (1) a genre of music represented by the input audio signal, (2) a time period of music represented by the input audio signal, or (3) a presence of an instrument in music represented by the input audio signal.

9. A method, comprising:
analyzing, by a neural network, a parameter of an input audio signal associated with a first input volume level to determine a classification group associated with the input audio signal;
determining an input volume of the input audio signal;
determining a classification gain value based on the classification group;
determining a target gain value as an intermediary value between the input volume and the classification gain value, wherein the target gain value is determined by applying one or more weights to the input volume and the classification gain value; and
generating a gain-adjusted volume by applying the target gain value to the input audio signal.

10. The method of claim 9, wherein the target gain value is determined by applying a first weight to the input volume and a second weight to the classification gain value.

11. The method of claim 9, wherein the method further comprises applying the intermediary value to the input audio signal, wherein the intermediary value modifies the first input volume level to a second volume level.

12. The method of claim 11, wherein the method further comprises applying a compression value to the input audio signal, wherein the compression value modifies the second volume level to a third volume level that satisfies a target volume threshold.

13. The method of claim 9, wherein the method further comprises determining if a source of the input audio signal has changed.

14. The method of claim 13, wherein determining if the source of the input audio signal has changed is based on at least one of: (1) a comparison of a current compressor gain associated with the input audio signal to a previous compressor gain associated with the input audio signal, (2) a comparison of a RMS power associated with the input audio signal to a previous RMS power associated with the input audio signal, or (3) a comparison of a current audio sample value associated with the input audio signal to a previous audio sample value associated with the input audio signal.

15. The method of claim 13, wherein the method further comprises, in response to determining the source of the input audio signal has changed, resetting the intermediary value of the input audio signal.

16. The method of claim 9, wherein the classification group comprises at least one of: (1) a genre of music represented by the input audio signal, (2) a time period of music represented by the input audio signal, or (3) a presence of an instrument in music represented by the input audio signal.

17. An apparatus, comprising:
one or more processors; and
a non-transitory machine-readable medium having stored thereon instructions that, when executed, cause one or more processors to perform a set of operations comprising:
analyzing, by a neural network, a parameter of an input audio signal associated with a first input volume level to determine a classification group associated with the input audio signal;
determining an input volume of the input audio signal;
determining a classification gain value based on the classification group;
determining a target gain value as an intermediary value between the input volume and the classification gain value, wherein the target gain value is determined by applying one or more weights to the input volume and the classification gain value; and
generating a gain-adjusted volume by applying the target gain value to the input audio signal.

18. The apparatus of claim 17, wherein the target gain value is determined by applying a first weight to the input volume and a second weight to the classification gain value.

19. The apparatus of claim 17, wherein the set of operations further comprises applying the intermediary value to the input audio signal, wherein the intermediary value modifies the first input volume level to a second volume level.

20. The apparatus of claim 19, wherein the set of operations further comprises applying a compression value to the input audio signal, wherein the compression value modifies the second volume level to a third volume level that satisfies a target volume threshold.

* * * * *